United States Patent
Nakano

(10) Patent No.: US 7,186,628 B2
(45) Date of Patent: Mar. 6, 2007

(54) METHOD OF MANUFACTURING AN SOI WAFER WHERE COP'S ARE ELIMINATED WITHIN THE BASE WAFER

(75) Inventor: Masatake Nakano, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/500,381

(22) PCT Filed: Jan. 7, 2003

(86) PCT No.: PCT/JP03/00034

§ 371 (c)(1),
(2), (4) Date: Jun. 29, 2004

(87) PCT Pub. No.: WO03/061012

PCT Pub. Date: Jul. 24, 2003

(65) Prior Publication Data

US 2005/0032331 A1    Feb. 10, 2005

(30) Foreign Application Priority Data

Jan. 9, 2002    (JP) .............................. 2002-001942

(51) Int. Cl.
*H01L 21/30* (2006.01)
(52) U.S. Cl. .............................. 438/455; 257/E21.122
(58) Field of Classification Search ................ 438/455, 438/458, 479; 257/E21.122
See application file for complete search history.

(56) References Cited

U.S. PATENT DOCUMENTS

| | | | |
|---|---|---|---|
| 6,362,076 B1 * | 3/2002 | Inazuki et al. ............... | 438/458 |
| 6,461,939 B1 * | 10/2002 | Furihata et al. ............. | 438/459 |
| 6,534,380 B1 * | 3/2003 | Yamauchi et al. .......... | 438/455 |
| 6,544,656 B1 * | 4/2003 | Abe et al. .................... | 428/446 |
| 6,544,862 B1 * | 4/2003 | Bryan ......................... | 438/455 |
| 6,596,610 B1 * | 7/2003 | Kuwabara et al. .......... | 438/458 |
| 6,846,718 B1 * | 1/2005 | Aga et al. .................... | 438/406 |
| 6,867,110 B2 * | 3/2005 | Yanagita et al. ............ | 438/459 |
| 6,959,854 B2 * | 11/2005 | Yokokawa et al. ......... | 228/201 |
| 2001/0038153 A1 * | 11/2001 | Sakaguchi .................. | 257/797 |

FOREIGN PATENT DOCUMENTS

| | | |
|---|---|---|
| EP | 0 843 344 A1 | 5/1998 |
| JP | A 5-211128 | 8/1993 |
| JP | A 9-64319 | 3/1997 |

(Continued)

*Primary Examiner*—Michael Lebentritt
*Assistant Examiner*—Stanetta Isaac
(74) *Attorney, Agent, or Firm*—Oliff & Berridge, PLC

(57) ABSTRACT

When an SOI wafer is produced by using a bond wafer made of silicon single crystal to form an SOI layer and a base wafer made of silicon single crystal to be a support substrate, one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as the bond wafer. Thereby, even where a thin insulator film or a thin SOI layer is formed in the SOI wafer, COPs are hardly detected in inspection of the SOI layer after the SOI wafer was completed, and a high quality SOI wafer is provided.

16 Claims, 3 Drawing Sheets

| | FOREIGN PATENT DOCUMENTS | | | | |
|---|---|---|---|---|---|
| JP | 10-200080 | 7/1998 | JP | 2001-144275 | 5/2001 |
| JP | A 11-40786 | 2/1999 | JP | A 2002-110684 | 4/2002 |
| JP | A 11-145436 | 5/1999 | JP | A 2002-176155 | 6/2002 |
| JP | A 11-297583 | 10/1999 | WO | WO 99/39380 A1 | 8/1999 |
| JP | A 2000-58801 | 2/2000 | WO | WO 01/17024 A1 | 3/2001 |
| JP | A 2000-178099 | 6/2000 | | | |

\* cited by examiner

SOI LAYER

INSULATOR FILM

BASE WAFER

100nm

SOI LAYER

INSULATOR FILM

BASE WAFER

100nm

METHOD OF MANUFACTURING AN SOI WAFER WHERE COP'S ARE ELIMINATED WITHIN THE BASE WAFER

TECHNICAL FIELD

The present invention relates to an SOI (Silicon On Insulator) wafer suitable for semiconductor device fabrication.

BACKGROUND ART

An SOI wafer is produced as follows, for example. An insulator film such as an oxide film (Box layer, which is to become a buried oxide film (insulator film)) is formed on at least one of a first silicon wafer (hereafter, called "bond wafer", from which an SOI layer is formed) having at least one flattened and mirror-polished main surface and a second silicon wafer (hereafter, called "base wafer", which is to become a support substrate). Each main surface of the two silicon wafers is bonded and joined to each other via the insulator film. After the wafers are subjected to a heat treatment to firmly join them, the other main surface opposite to the bonded main surface of the bond wafer is ground and polished to have a predetermined thickness, and thereby an SOI layer (an element fabrication layer) is formed on the insulator film, so that an SOI wafer is produced.

It is often the case that such a production method is mainly used for producing an SOI wafer having an SOI layer having a thickness of about 0.5 μm or more.

On the other hand, making an insulator film and an SOI layer thinner has been developed, and an SOI wafer having an SOI layer and an insulator film, which have a thickness of about 0.4 μm or less respectively, has also been produced. In this case, although the SOI wafer is difficult to be produced by the above method, a production method of an SOI wafer based on an ion implantation delamination method (also called "Smart Cut Method" (registered trademark)), for example, disclosed in Japanese Patent Laid-open (Kokai) Publication No. 5-211128, can be utilized.

In the ion implantation delamination method, for example, an insulator film is formed on at least one of a bond wafer made of silicon single crystal to form an SOI layer and a base wafer made of silicon single crystal to be an support substrate, a micro bubble layer is formed in the bond wafer by implanting gas ions from a main surface of the bond wafer. Then, the ion-implanted main surface of the bond wafer is bonded to a main surface of the base wafer via the insulator film, thereafter the bonded wafer is subjected to a heat treatment to delaminate the wafers at the micro bubble layer as a border, and the delaminating plane to form an SOI layer is subjected to a slight polishing to produce an SOI wafer.

For bond wafers used in the above two production method, there are commonly used wafers obtained from a silicon single crystal grown by a Czochralski method (hereafter, called "CZ method"), by which substrates having a large diameter can be produced at low cost (hereafter, such a wafer may be called "CZ wafer").

However, defects called COP (Crystal Originated Particle) exist on a surface and the inside of the CZ wafer, and may become a problem in a device process.

The COP is one of crystal defects introduced in crystal growth, typically, is a void type defect having a regular octahedral structure (single type) shown in FIG. 2, and is generally formed with a size of 60–130 nm.

When a surface of a silicon wafer is measured by means of a particle counter directly after mirror-polishing or after cleaning the mirror-polished surface with a mixed solution of ammonia and a hydrogen peroxide solution, this COP 10 is detected as a bright spot together with real particles.

In addition, there also exists COP 11 having a double-connected structure (twin type) as shown in FIG. 3 or COP having a triple-connected structure (triplet type). It was revealed that these COPs are formed in the order of a size of 100–300 nm due to the fact that single type COPs grow in a cooling process of a growing single crystal.

If a CZ wafer having COPs is used as a bond wafer to produce an SOI wafer, the bond wafer has harmful effects on, for example, Time Dependent Dielectric Breakdown (TDDB) and Time Zero Dielectric Breakdown (TZDB) of an oxide film, which are important electric characteristics for devices.

Moreover, there are some cases that COPs existing on a surface to be bonded of a bond wafer penetrate an SOI layer and form pinholes. In such a case, for example, an insulator film separating a base wafer and an SOI layer is etched with an etchant in an etching process or an atmosphere gas in a heat treatment process intruding from the pinholes and steps are generated in a wiring process to cause breaking of a wire. Consequently, there was caused a problem such that yield of a device process was decreased.

In order to solve such a problem, there is disclosed in Japanese Patent Laid-open (Kokai) Publication No. 11-145436 a technique that a hydrogen annealed wafer, an intrinsic gettering wafer, or an epitaxial wafer, in which COPs near its surface are reduced or eliminated, is used as a bond wafer. When such a bond wafer in which COPs are reduced or eliminated is used to produce an SOI wafer, the SOI wafer containing no COP in the SOI layer can be obtained.

In this case, since the bond wafer with high quality and high cost as described above is needed, the base wafer with reduced cost is sometimes used. The base wafer used for the SOI wafer is required originally for supporting an SOI layer via an insulator film, thus, no element is formed on surface of the base wafer. Therefore, a wafer having COPs on its surface is used as the base wafer, and moreover, as disclosed in Japanese Patent Laid-open (Kokai) Publication No. 11-40786, a dummy-grade silicon wafer of which resistivity and the like do not meet product standards is also used as a base wafer. Since the dummy-grade silicon wafers are being marketed at about half the price of regular wafers, it has a great effect on reduction in cost.

However, even where the silicon wafer in which COPs are reduced as aforementioned is used as a bond wafer, when a thinner SOI layer and a thinner insulator film are formed to produce an SOI wafer which has been required recently, there are some cases that a considerable number of COPs are detected in the inspection of the SOI layer after completing the SOI wafer, and also there arose the phenomenon that a high quality wafer as expected can not be obtained.

DISCLOSURE OF THE INVENTION

Accordingly, an object of the present invention is to provide a high quality SOI wafer that, even where an insulator film and an SOI layer are formed to be thinner in the SOI wafer, COPs are hardly detected in inspection of the SOI layer after the SOI wafer was completed.

In order to accomplish the above object, the inventor of the present invention observed cross sections of portions including COPs detected in the inspection of the SOI layer using a tunneling electron microscope (TEM), and found that COPs did not exist in the SOI layer, but existed on a surface of a base wafer serving as a support substrate, as shown in FIG. 4. Namely, it became clear that since the SOI layer and the insulator film were made thin, COPs existing in the base wafer had been detected as COPs existing in the SOI layer.

Moreover, FIG. 5 shows another COP observed by the TEM. In this case also, it was revealed that the COP did not exist in the SOI layer, but existed on a surface of the base wafer, and moreover, the insulator film and the base wafer could not be bonded in the region in which the COP existed, resulting in a micro void. It is considered that such a micro void was generated by reason that the insulator film had a thickness of 100–200 nm (0.1–0.2 μm), a gap between the base wafer and the insulator film could not be filled in by even flowage of the insulator film, and thus remained as a micro void.

Accordingly, in the present invention, in order to accomplish the above object, there is provided a method of producing an SOI wafer comprising at least the steps of forming an insulator film on at least one of a bond wafer made of silicon single crystal to form an SOI layer and a base wafer made of silicon single crystal to be an support substrate, bonding each main surface of the bond wafer and the base wafer via the insulator film, and making the bond wafer bonded to the base wafer thinner, wherein one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as the base wafer.

As described above, when the SOI wafer is produced by bonding the bond wafer to the base wafer via the insulator film and thinning the bond wafer, if an epitaxial wafer, an FZ wafer, a nitrogen doped wafer, a hydrogen annealed wafer, an intrinsic gettering wafer, a nitrogen doped and annealed wafer, or an entire N-region wafer is used as the base wafer, an SOI wafer that COPs hardly exist near a surface of the base wafer can be obtained. Therefore, even if the insulator film and the SOI layer are thinner, there is no case that many COPs due to the base wafer are detected in the inspection after the SOI wafer was completed, and thus measurements which precisely reflect the number of COPs in the SOI layer can be performed. And also, a high quality SOI wafer that generation of micro voids at an interface between the base wafer and the insulator film is suppressed can be produced.

Further, according to the present invention, there is provided a method of producing an SOI wafer comprising at least the steps of forming an insulator film on at least one of a bond wafer made of silicon single crystal to form an SOI layer and a base wafer made of silicon single crystal to be an support substrate, forming a micro bubble layer in the bond wafer by implanting gas ions from a main surface of the bond wafer, bonding the ion-implanted main surface of the bond wafer to a main surface of the base wafer via the insulator film, and delaminating the bonded wafer at the micro bubble layer as a border, wherein one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as the base wafer.

Namely, when an SOI wafer is also produced by the ion implantation delamination method, if the silicon wafer that COPs are reduced as described above is used as the base wafer, an SOI wafer that COPs do not exist or are extremely reduced on a surface of the base wafer can be produced. Particularly, even in the case of making the SOI layer extremely thinner by the ion implantation delamination method, no or only a few COPs due to the base wafer are detected in the inspection after the SOI wafer was completed, and thus there can be produced a high quality SOI wafer that generation of micro voids at an interface between the base wafer and the insulator film is suppressed.

It is preferable that as the bond wafer also, one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used.

If the SOI wafer is produced by using the above wafer as the bond wafer, since COPs hardly exist in the SOI layer formed from the bond wafer as well as on the surface of the base wafer, there are fewer cases that COPs are detected in the inspection of the SOI layer after the SOI wafer was completed, and thus there can be produced an extremely high quality SOI wafer in which generation of micro voids is further effectively suppressed.

In the present invention, it is possible that the SOI layer to be formed has a thickness of 0.3 μm or less, and the insulator film to be formed has a thickness of 0.4 μm or less.

As described above, when the SOI layer and the insulator film are thinner, COPs on the surface of the base wafer are detected as COPs of the SOI layer. However, in the present invention, since a silicon wafer that COPs do not exist or are extremely reduced on its surface or in its inside is used as the base wafer, even when the SOI layer having a thickness of 0.3 μm or less is formed by the ion implantation delamination method, or the insulator film having a thickness of 0.4 μm or less is formed, the inspection of the SOI layer after completion is not affected by COPs on the surface of the base wafer. Therefore, the present invention is very useful particularly for the case forming the thinner SOI layer and the thinner insulator film.

Moreover, according to the present invention, there is also provided an SOI wafer wherein it is produced by the aforementioned method.

As described above, in the SOI wafer produced by the production method of the present invention, COPs do not exist or are extremely reduced on the surface of the base wafer. Therefore, even when the SOI layer or the insulator film is formed to be thinner, COPs on the surface of the base wafer are not detected in inspection. And also, generation of micro voids at an interface between the base wafer and the insulator film is suppressed, and therefore, a high quality SOI wafer satisfying the recent requirements for thinning can be obtained.

In such an SOI wafer, quality of the SOI layer on which elements are to be formed in a device process can be precisely inspected. Therefore, there is no case that COPs on the surface of the base wafer are detected as COPs in the SOI layer and the thus-detected SOI wafer is regarded as an inferior product, which has occurred conventionally. As a result, it can lead to yield improvement and cost reduction in a device process.

As explained above, in the present invention, when an SOI wafer is produced, an SOI wafer is produced by using as a base wafer a silicon wafer in which COPs do not exist or are reduced. According to this, for example, even if the SOI layer or the insulator film is thinner, COPs due to the base wafer are not detected in the inspection of the SOI wafer. Therefore, inspection yield can be improved, and a high quality SOI wafer in which generation of micro voids is suppressed can be obtained.

Further, in such an SOI wafer, the SOI layer on which elements are formed can be precisely inspected to see whether it is good or bad before device fabrication, which can lead to improvement of device yield and reduction in production cost.

BEST MODE FOR CARRYING OUT THE INVENTION

Hereinafter, embodiments of the present invention will be explained in detail. However, the present invention is not limited thereto.

In the present invention, an SOI wafer is produced by using as a base wafer for producing the SOI wafer, a wafer in which COPs do not exist or are reduced. Thereby, there is provided a high quality SOI wafer, wherein COPs in the base wafer, which may be detected as COPs existing in the SOI layer during inspection of the SOI wafer, are excluded, and at the same time, generation of micro voids at an interface between the base wafer and the insulator film is suppressed.

In the present invention, the SOI wafer can be produced basically in accordance with ordinary processes except for using a base wafer on a surface of which COPs do not exist or are reduced as above. Therefore, for example, a production method of an SOI wafer by the ion implantation delamination method can be applied to the present invention.

FIGS. 1(a) to (h) are schematic views showing one example of a production process of an SOI wafer by the ion implantation delamination method in order.

Figure 1:
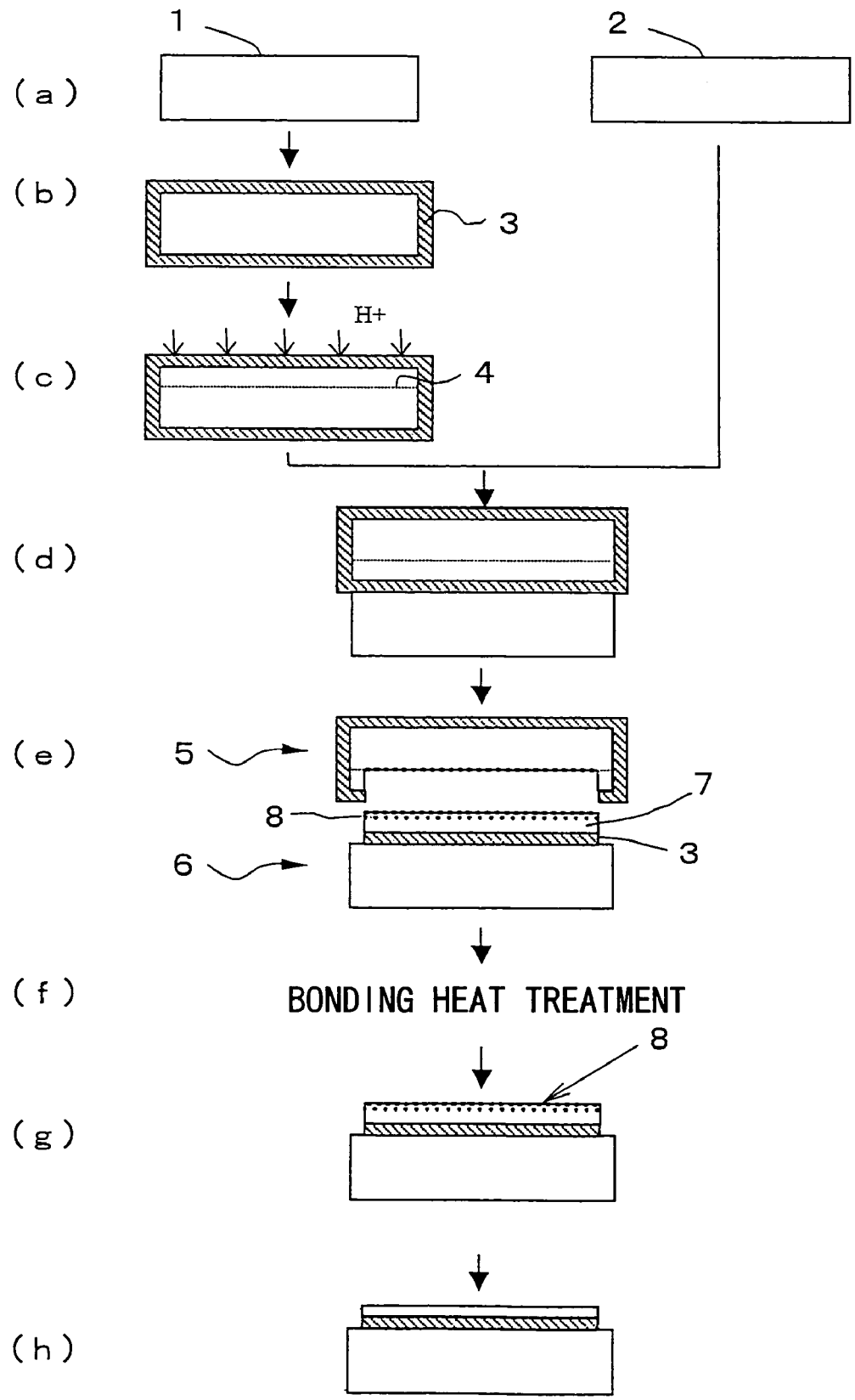
FIGS. 1(a) to (h) show one example of a production process of an SOI wafer by the ion implantation delamination method.
Figure 2:
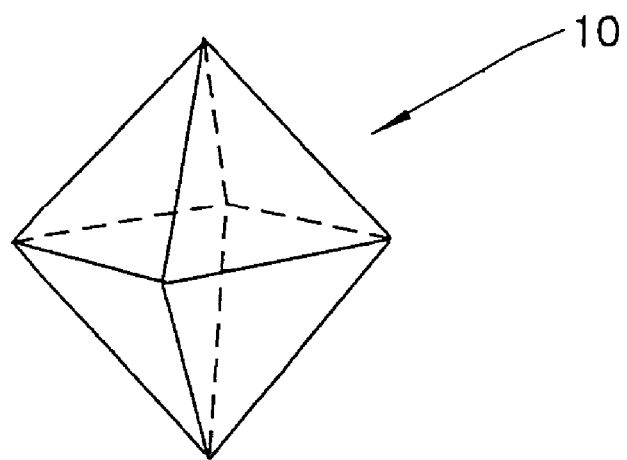
FIG. 2 is a typical view of a structure of a COP.
Figure 3:
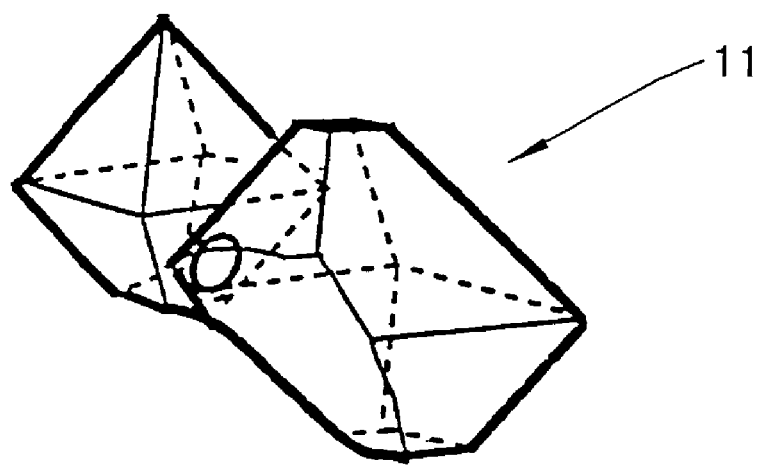
FIG. 3 is a typical view showing a twin type COP (void).
Figure 4:
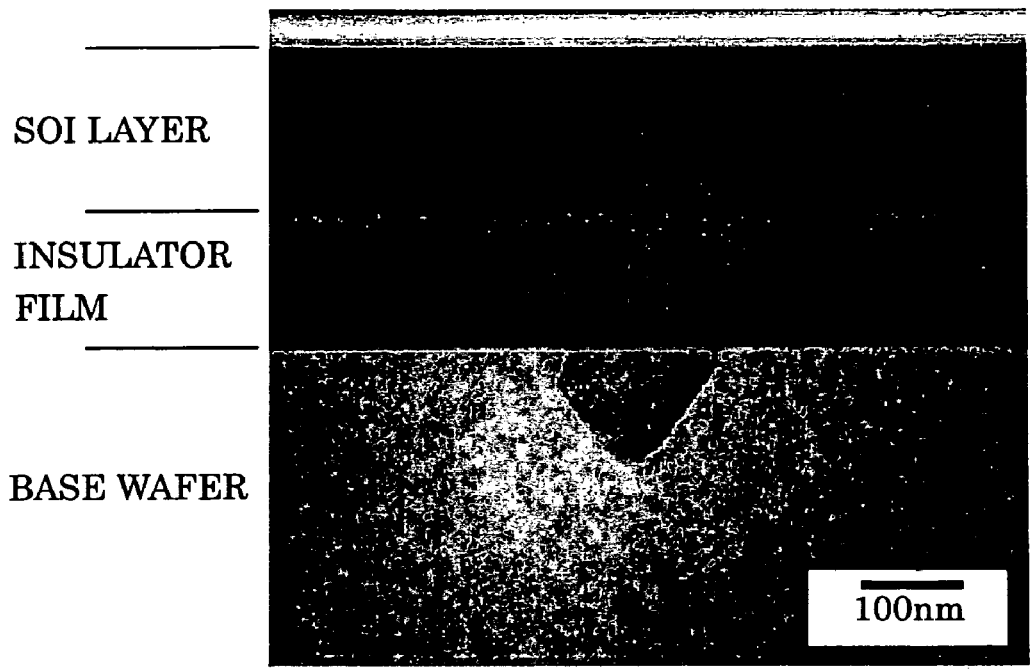
FIG. 4 is a cross-sectional observation view near a COP observed by TEM.
Figure 5:
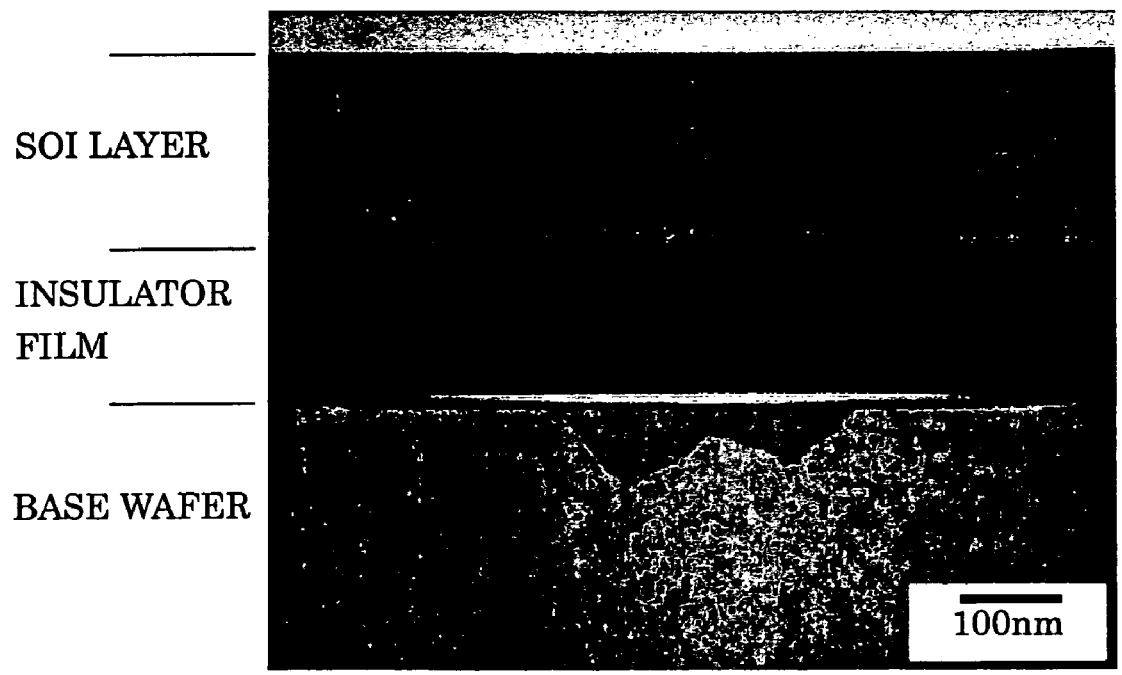
FIG. 5 is a cross-sectional observation view near another COP observed by TEM.

In this production method, first, as shown in FIG. 1(a), a bond wafer 1 and a base wafer 2 in which at least each one main surface is flattened and mirror-polished are prepared. At this point, in the present invention, a silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as the base wafer 2. In any of these wafers, COPs do not exist or are reduced on its surface.

Here, some silicon wafers used in the present invention as described above are explained as follows. An FZ wafer is a wafer obtained from a silicon single crystal ingot produced by FZ method (Floating Zone melting method), and has no COPs.

An epitaxial wafer is a wafer made by forming an epitaxial layer on a silicon single crystal substrate. Since the epitaxial layer has no COPs, if the wafer is used as a base wafer, it is prevented that COPs of the base wafer are detected as COPs of the SOI layer.

A nitrogen doped wafer is a wafer doped with nitrogen during its crystal growth by the CZ method. By doping with nitrogen, growth of COPs can be suppressed, and the size of COPs becomes about 100 nm or less. When such a wafer is used as a base wafer, even if the SOI layer is thinner, there are few cases that COP on the surface of the base wafer is detected as COP of the SOI layer, and generation of micro voids can be suppressed.

Also, a nitrogen doped and annealed wafer is a wafer, wherein a nitrogen doped wafer is annealed under an atmosphere of a hydrogen gas, an inert gas, a mixed gas of those, or the like. As aforementioned, the COPs in the nitrogen doped wafer have a size of about 100 nm or less. When this wafer is further annealed under an atmosphere of hydrogen, an inert gas, or a mixed gas of those, COPs on the wafer surface can be disappeared thereby. By using such a wafer as a base wafer, there is no case that COPs on the surface of the base wafer are detected as COPs of the SOI layer in the inspection of the SOI wafer, and therefore, no micro voids are generated.

A hydrogen annealed wafer is a wafer made by annealing a CZ wafer under an atmosphere of hydrogen, an inert gas, or a mixed gas of those. Although a hydrogen annealed wafer is not the same level as in the nitrogen doped and annealed wafer, COPs can also be reduced only by hydrogen annealing.

An intrinsic gettering wafer is a silicon wafer, a surface layer part of which is a so-called DZ layer, i.e., defect-free layer, wherein gettering is performed based on micro defects distributed inside a bulk. In this case also, since COPs on the surface of the wafer are reduced, by using the wafer as a base wafer, the detection of COPs on the surface of the base wafer in inspection and generation of micro voids can be prevented.

Moreover, an entire N-region wafer is a wafer obtained from a crystal grown in an N-region free from grown-in defects such as COPs for the whole crystal while controlling V/G (V: pulling rate, G: temperature gradient along the axis direction in a crystal solid-liquid interface) when the crystal is grown by the CZ method. If such a wafer is used as a base wafer, like the aforementioned wafer, the detection of COPs on the surface of the base wafer in inspection and generation of micro voids can be prevented.

In addition, the N-region will be explained as follows. In a silicon single crystal, there are a region called a V-region which contains a relatively large number of vacancies, i.e., depressions, pits, and the like generated due to missing silicon atoms, a region called an I-region which contains a relatively large number of dislocations generated due to excess of silicon atoms and clusters of excess silicon atoms, and a neutral region called an N-region which exists between the V-region and the I-region and contains no (or few) missing or excess atoms.

When the entire N-region wafer is produced, the method disclosed in Japanese Patent Laid-open (Kokai) Publication No. 2000-178099 can be applied, for example. Namely, a silicon single crystal is pulled while adjusting a structure in a furnace by means of heat insulating materials and the like provided around a solid-liquid interface of the crystal in the pulling furnace so that the V/G value is controlled to maintain an entire N-region in a radial direction, and then the entire N-region wafer can be obtained from the silicon single crystal.

In the present invention, the silicon wafer that COPs do not exist or are extremely reduced on its surface as described above is used as the base wafer, and as for the bond wafer also, it is preferable that a silicon wafer selected from the silicon wafers as described above is used as the bond wafer.

Namely, if an epitaxial wafer, an FZ wafer, a nitrogen doped wafer, a hydrogen annealed wafer, an intrinsic gettering wafer, a nitrogen doped and annealed wafer, or an entire N-region wafer is used as a bond wafer, there can be obtained an SOI wafer that in the SOI layer and in the vicinity of surface of the base wafer, COPs do not exist, or COPs exist but are extremely few. Thus, there are further fewer cases that COPs are detected in the inspection of the SOI layer after the SOI wafer was completed. Also, an extremely high quality SOI wafer that generation of micro voids can be further effectively suppressed at an interface between the base wafer and the SOI layer can be produced.

After the bond wafer 1 and the base wafer 2 as described above are prepared, an insulator film 3 is formed on at least one of these wafers. In FIG. 1(b), an oxide film is formed on the bond wafer 1.

Although the thickness of the insulator layer 3 to be formed is not limited particularly in the present invention, it is possible to form an extremely thin insulator film having a thickness of 0.4 µm or less. That is, when each thickness of the insulator film and the SOI layer in the produced SOI wafer is thinner, COPs on the surface of the base wafer are also detected as COPs of the SOI layer. However, in the present invention, since the silicon wafer that COPs do not exist or COPs are extremely reduced near its surface is used as the base wafer, even when the thickness of the insulator film to be formed is 0.4 µm or less (or, moreover, 0.1 µm or less), there can be obtained the SOI wafer such that only a few COPs of the base wafer are detected in inspection of the SOI layer after the SOI wafer was completed.

After the insulator film is formed, as shown in FIG. 1(c), hydrogen ions, for example, are implanted from a side of a polished main surface of the bond wafer in an implantation dose of about $10^{16}$ or $10^{17}$ atoms/cm$^2$. Thereby, a micro bubble layer 4 is formed inside the bond wafer.

Since the depth of the micro bubble layer 4 is reflected as the thickness of the SOI layer to be formed, the micro bubble layer 4 may be formed in a certain depth depending on a target thickness of the SOI layer. In the present invention, since a silicon wafer that COPs do not exist or are extremely reduced on its surface is used as a base wafer, even if a very thin SOI layer is formed thereon, there can be obtained the SOI wafer such that COPs are not detected in the inspection of the SOI layer after the SOI wafer was completed. Therefore, as for the thickness of the SOI layer to be formed in the present invention, the micro bubble layer 4 may be formed so that the SOI layer is made extremely thin, i.e., has a thickness of 0.3 µm or less, or 0.1 µm or less, which is required in recent years.

Next, as shown in FIG. 1(d), the ion-implanted surface of the bond wafer and the polished main surface of the base wafer are bonded and joined to each other via the insulator film (oxide film) 3.

After the wafers are bonded, the bonded wafer is delaminated at the micro bubble layer 4 as a border. In this case, for example, by subjecting the bonded wafer to a heat treatment at 400° C. to 500° C., the bond wafer can be cleaved at the micro bubble layer 4 as shown in FIG. 1(e). The bond wafer 5 after cleavage is polished again, and then, can be reused as a new bond wafer or base wafer.

On the other hand, the bonded substrate 6 (SOI wafer) having an SOI structure containing the SOI layer 7 and the insulator film 3 is subjected to a bonding heat treatment for increasing bonding strength as shown in FIG. 1(f). And then, as shown in FIGS. 1(g) and (h), by subjecting the cleavage plane (delaminating plane) 8 to a slight polishing, an SOI wafer is completed.

Although the method of producing an SOI wafer by the ion implantation delamination method is explained as above, the present invention can also be applied to a case that after the bond wafer and the base wafer are bonded, the bond wafer is thinned to a predetermined thickness by grinding and polishing to produce an SOI wafer.

Namely, in this case also, one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as a base wafer.

An insulator film such as an oxide film is formed on at least one of the bond wafer and the base wafer, and then the bond wafer and the base wafer are bonded to each other's main surface via the insulator film. Next, after the bonded wafer is subjected to a heat treatment for increasing bonding strength, the other main surface opposite to the main surface bonded to the base wafer of the bond wafer is ground and polished to thin the bond wafer bonded to the base wafer to a predetermined thickness, and thereby an SOI layer is formed on the insulator film.

When an SOI wafer is also produced by this method, it is preferable that a silicon wafer in which COPs do not exist or are extremely reduced is used as the bond wafer as well as the base wafer. Each thickness of the insulator film and the SOI layer is also the same as in the case of the aforementioned ion implantation delamination method.

Hereinafter, the present invention will be explained further in detail with reference to Examples and Comparative Example. However, the present invention is not limited thereto.

EXAMPLE 1

By using a so-called MCZ method in which a magnetic field is applied to a silicon melt, a silicon single crystal ingot was grown at a pulling rate of 1.8 mm/min. This silicon crystal ingot was processed into silicon wafers by slicing, etching, polishing, and the like, and wafers having a crystal orientation of <100>, a conductivity type of P-type, a resistivity of 10 Ω·cm, and a diameter of 200 mm were produced.

The silicon wafers were subjected to a heat treatment using an RTA apparatus (Rapid Thermal Annealler: a rapid heating/rapid cooling apparatus, SHS-2800, manufactured by AST Corporation) under an atmosphere of 100% hydrogen, at 1200° C., for 10 seconds. In order to use the wafers as both a bond wafer and a base wafer, each surface to be bonded was polished with a stock removal of 10 nm so that haze and the like generated due to the heat treatment on the wafer surface were removed.

By using such a bond wafer and a base wafer, an SOI wafer of which SOI layer has a thickness of 100 nm was produced through the processes shown in FIGS. 1(a)–(h). The main production conditions are as follows.

Oxide film forming conditions: 100 nm on the surface of the bond wafer.

Hydrogen ion implantation conditions: implantation energy: 25 keV, implantation dose: $8 \times 10^{16}$ atoms/cm$^2$.

Delamination heat treatment conditions: under N$_2$ gas atmosphere, 500° C., 30 minutes.

Bonding heat treatment conditions: under N$_2$ gas atmosphere, 1150° C., 2 hours.

COPs on thus produced SOI wafer were observed by a particle counter.

As a result, the number of COPs observed on the wafer was 9 numbers/wafer. Also, when cross sections of points where these COPs exist were observed by the TEM, it was found that 4 COPs were generated on the base wafer, but micro voids did not exist therein.

EXAMPLE 2

A silicon single crystal ingot was grown under the same conditions as in Example 1 except that the ingot was doped with nitrogen of $1\times10^{14}$ atoms/cm$^3$. The single crystal ingot was processed into silicon wafers by slicing, etching, polishing, and the like, and thereby wafers having a crystal orientation of <100>, a conductivity type of P-type, a resistivity of 10 Ω·cm, and a diameter of 200 mm were produced.

Such wafers are used as a bond wafer and a base wafer, and an SOI wafer was produced by the same processes and production conditions as in Example 1. And then, the number of COPs was observed by the particle counter as in Example 1.

As a result, the number of COPs observed on the wafer was 7 numbers/wafer. Also, when cross sections of points where the COPs exist were observed by the TEM, it was found that COPs generated on the base wafer were 4 numbers/wafer. However, micro voids did not exist therein.

EXAMPLE 3

The same crystal ingot as in Example 2 was processed into wafers by slicing, etching, polishing, and the like, and wafers having a crystal orientation of <100>, a conductivity type of P-type, a resistivity of 10 Ω·cm, and a diameter of 200 mm were obtained.

Such silicon wafers were subjected to a heat treatment under an atmosphere of argon gas at 1200° C. for 1 hour. In order to use the wafers as both a bond wafer and a base wafer, each surface to be bonded was polished with a stock removal of 10 nm so that haze and the like generated due to the heat treatment on each wafer surface were removed.

By using the bond wafer and the base wafer, an SOI wafer was produced under the same processes and production conditions as in Example 1. And then, the number of COPs was observed by the particle counter as in Example 1.

As a result, the number of COPs observed on the wafer was 1 number/wafer. Also, when a cross section of the points where the COP exists was observed by the TEM, micro voids did not exist in the base wafer.

EXAMPLE 4

A silicon single crystal ingot was grown while controlling the V/G value to 0.18 mm$^2$/K·min. This single crystal ingot was processed into entire N-region silicon wafers by slicing, etching, polishing, and the like, and thereby wafers having a crystal orientation of <100>, a conductivity type of P-type, a resistivity of 10 Ω·cm, and a diameter of 200 mm were produced.

Such wafers were used as a bond wafer and a base wafer, and an SOI wafer was produced under the same processes and production conditions as in Example 1. And then, the number of COPs was observed by the particle counter as in Example 1.

As a result, the number of COPs observed on the wafer was 4 numbers/wafer. Also, when cross sections of points where the COPs exist were observed by the TEM, it was found that the COP generated on the base wafer was 1 number/wafer. However, a micro void did not exist therein.

COMPARATIVE EXAMPLE

A silicon single crystal was grown under the same conditions as in Example 1, and silicon wafers were produced. By using the wafers as a bond wafer and a base wafer, an SOI wafer was produced in the same processes as in Example 1 except that the base wafer was not subjected to a heat treatment by the RTA apparatus.

The SOI wafer was observed by the particle counter as in Example 1. As a result, the number of COPs observed on the wafer was 47. Also, when points where the COPs exist were observed by the TEM, COPs generated on the base wafer were 40 numbers/wafer, and a micro void was observed in the point where twin type COP exists.

(Inspection Yield Examination)

When 50 SOI wafers were produced by the method of the present invention and inspected, the inspection yield was improved to 10% or more.

In addition, it was also found that micro voids, which can not be detected by an ultrasonic reflectoscope, could be eliminated.

The present invention is not limited to the embodiments described above. The above-described embodiments are mere examples, and those having the substantially same structure as that described in the appended claims and providing the similar functions and advantages are included in the scope of the present invention.

The invention claimed is:

1. A method of producing an SOI wafer comprising at least the steps of forming an insulator film on at least one of a bond wafer made of silicon single crystal to form an SOI layer and a base wafer made of silicon single crystal to be a support substrate, bonding each main surface of the bond wafer and the base wafer via the insulator film, and making the bond wafer bonded to the base wafer thinner, wherein the base wafer is one silicon wafer selected from a group consisting of an epitaxial wafer, a nitrogen doped wafer, a hydrogen annealed wafer, a nitrogen doped and annealed wafer, and an entire N-region wafer.

2. The method of producing an SOI wafer according to claim 1, wherein one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as the bond wafer.

3. The method of producing an SOI wafer according to claim 2, wherein the insulator film to be formed has a thickness of 0.4 μm or less.

4. An SOI wafer produced by the method according to claim 2.

5. The method of producing an SOI wafer according to claim 1, wherein the insulator film to be formed has a thickness of 0.4 μm or less.

6. An SOI wafer produced by the method according to claim 1.

7. A method of producing an SOI wafer comprising at least the steps of forming an insulator film on at least one of a bond wafer made of silicon single crystal to form an SOI layer and a base wafer made of silicon single crystal to be a support substrate, forming a micro bubble layer in the bond wafer by implanting gas ions from a main surface of the bond wafer, bonding the ion-implanted main surface of the bond wafer to a main surface of the base wafer via the insulator film, and delaminating the bonded wafer at the micro bubble layer as a border, wherein the base wafer is one silicon wafer selected from a group consisting of an epitaxial wafer, a nitrogen doped wafer, a hydrogen annealed wafer, a nitrogen doped and annealed wafer, and an entire N-region wafer.

8. The method of producing an SOI wafer according to claim 7, wherein one silicon wafer selected from a group consisting of an epitaxial wafer, an FZ wafer, a nitrogen doped wafer, a hydrogen annealed wafer, an intrinsic gettering wafer, a nitrogen doped and annealed wafer, and an entire N-region wafer is used as the bond wafer.

9. The method of producing an SOI wafer according to claim 8, wherein the SOI layer to be formed has a thickness of 0.3 μm or less.

10. The method of producing an SOI wafer according to claim 9, wherein the insulator film to be formed has a thickness of 0.4 μm or less.

11. The method of producing an SOI wafer according to claim 8, wherein the insulator film to be formed has a thickness of 0.4 μm or less.

12. An SOI wafer produced by the method according to claim 8.

13. The method of producing an SOI wafer according to claim 7, wherein the SOI layer to be formed has a thickness of 0.3 μm or less.

14. The method of producing an SOI wafer according to claim 13, wherein the insulator film to be formed has a thickness of 0.4 μm or less.

15. The method of producing an SOI wafer according to claim 7, wherein the insulator film to be formed has a thickness of 0.4 μm or less.

16. An SOI wafer produced by the method according to claim 7.

* * * * *